(12) United States Patent
Zheng et al.

(10) Patent No.: US 8,766,528 B2
(45) Date of Patent: Jul. 1, 2014

(54) PHOSPHOR AND LEDS CONTAINING SAME

(75) Inventors: Yi Zheng, Lynnfield, MA (US); Nathan Zink, North Andover, MA (US); Victor Perez, Lawrence, MA (US)

(73) Assignee: Osram Sylvania Inc., Danvers, MA (US)

( * ) Notice: Subject to any disclaimer, the term of this patent is extended or adjusted under 35 U.S.C. 154(b) by 39 days.

(21) Appl. No.: 13/538,542

(22) Filed: Jun. 29, 2012

(65) Prior Publication Data

US 2013/0002129 A1   Jan. 3, 2013

Related U.S. Application Data

(63) Continuation-in-part of application No. PCT/US2011/030536, filed on Mar. 30, 2011.

(60) Provisional application No. 61/319,666, filed on Mar. 31, 2010.

(51) Int. Cl.
| | | |
|---|---|---|
| *H01J 1/62* | (2006.01) | |
| *H01J 63/04* | (2006.01) | |
| *C04B 35/44* | (2006.01) | |
| *C09K 11/77* | (2006.01) | |
| *H01L 33/50* | (2010.01) | |

(52) U.S. Cl.
CPC ..... *C09K 11/7774* (2013.01); *C04B 2235/3225* (2013.01); *C04B 2235/764* (2013.01); *C04B 2235/9661* (2013.01); *C04B 2235/656* (2013.01); *C04B 2235/6582* (2013.01); *C04B 35/44* (2013.01); *C04B 2235/3229* (2013.01); *C04B 2235/6588* (2013.01); *C04B 2235/9653* (2013.01); *H01L 33/502* (2013.01); *C04B 2235/3224* (2013.01)
USPC ...... 313/503; 313/498; 313/501; 252/301.4 R

(58) Field of Classification Search
USPC ............ 313/598, 498, 501, 503; 252/301.4 R
See application file for complete search history.

(56) References Cited

U.S. PATENT DOCUMENTS

| 5,998,925 A | 12/1999 | Shimizu et al. |
|---|---|---|
| 6,669,866 B1 | 12/2003 | Kummer et al. |

(Continued)

FOREIGN PATENT DOCUMENTS

| CN | 1482208 A | 3/2004 |
|---|---|---|
| KR | 10-2008-0110857 A | 12/2008 |
| WO | 2008-012712 A1 | 1/2008 |
| WO | 2008-058462 A1 | 5/2008 |

OTHER PUBLICATIONS

Sato et al., Spectral Parameters of Nd3+-ion in the Polycrystalline Solid-Solution Composed of Y3Al5O12 and Y3Sc2Al3O13, Jpn. J. Appl. Phys., 42 (2003) 5071-5074.

(Continued)

*Primary Examiner* — Nimeshkumar Patel
*Assistant Examiner* — Thomas A Hollweg
(74) *Attorney, Agent, or Firm* — Robert F. Clark

(57) ABSTRACT

There is herein described a phosphor for use in white pc-LED applications. The phosphor has a composition represented by $(Y_{1-x-y}Gd_xCe_y)_3(Al_{1-z}Sc_z)_5O_{12}$ wherein $0<x\le0.3$, $0<y\le0.04$ and $0<z\le0.3$. White pc-LEDs containing the phosphor exhibit less sensitivity to variations in the blue emission of LED dies than pc-LEDs containing conventional YAG:Ce and YGdAG:Ce phosphors. The phosphor may used in multiple pc-LED configurations including as a sintered ceramic converter or applied as a powder dispersed in a silicone encapsulant.

5 Claims, 8 Drawing Sheets

(56) References Cited

U.S. PATENT DOCUMENTS

| | | |
|---|---|---|
| 6,809,347 B2 | 10/2004 | Tasch et al. |
| 6,943,380 B2 | 9/2005 | Ota et al. |
| 7,045,826 B2 | 5/2006 | Kim et al. |
| 7,267,787 B2 | 9/2007 | Dong et al. |
| 2004/0004437 A1* | 1/2004 | Shimizu et al. ............... 313/512 |
| 2005/0088077 A1 | 4/2005 | Naum et al. |
| 2008/0089825 A1* | 4/2008 | Tamaki et al. ................ 423/263 |
| 2009/0284149 A1* | 11/2009 | Koshikawa et al. .......... 313/512 |
| 2011/0309302 A1* | 12/2011 | Vishnyakov et al. .. 252/301.4 R |
| 2012/0001214 A1 | 1/2012 | Ooyabu et al. |
| 2012/0326169 A1 | 12/2012 | Zheng |

OTHER PUBLICATIONS

Feng et al., Preparation of transparent Ce:YSAG ceramic and its optical properties, J. Eur. Ceram. Soc., 28 (2008) 2539-2543.
Search report for PCT/US2011/030536 mailed Nov. 22, 2011.

* cited by examiner

PHOSPHOR AND LEDS CONTAINING SAME

CROSS REFERENCES TO RELATED APPLICATIONS

This application is a continuation-in-part of International Application PCT/US2011/030536, with an international filing date of Mar. 30, 2011, which claims the benefit of U.S. Provisional Application No. 61/319,666, filed Mar. 31, 2010, the disclosures of which are incorporated herein by reference.

TECHNICAL FIELD OF THE INVENTION

This invention relates to light emitting diodes (LEDs) and more particularly to phosphors for use in LED applications such as phosphor-conversion LEDs.

BACKGROUND OF THE INVENTION

Current white-light-emitting phosphor-conversion LEDs (pc-LEDs) utilize one or more phosphors to partially absorb the blue light emitted by InGaN LED dies in order to convert some of the emitted blue light into a yellow light. The remaining blue light and converted yellow light combine to produce light which is perceived as white. While other phosphors may be used in addition to the yellow-emitting phosphor to modify the spectral output of the pc-LED, the yellow-emitting phosphor remains the central component in white pc-LEDs.

By far the most used yellow-emitting phosphor in white pc-LEDs is a cerium-activated yttrium aluminum garnet, $Y_3Al_5O_{12}$:Ce, phosphor (YAG:Ce). An example of a YAG:Ce phosphor and its application in a white pc-LED is described in U.S. Pat. No. 5,998,925. Some composition modifications of YAG:Ce phosphors are also described, such as using Ga to replace Al (YAGaG:Ce) or Gd to replace Y (YGdAG:Ce). Generally, a Ga substitution of Al in YAG:Ce shifts the phosphor's emission peak to shorter wavelengths whereas a Gd substitution of Y shifts the emission peak to longer wavelengths.

One of the challenges in making white pc-LEDs is maintaining color consistency between the white pc-LED packages. A major contributor to this problem and one which is difficult to control from a package manufacturing perspective is related to variations in the dominant emission wavelength ($\lambda_d$) of LED dies. In particular, the blue emission of LED dies can have a large range, e.g., 440 nm to 470 nm, resulting from the semiconductor manufacturing process. This inherent die-to-die variation is accentuated when the LED die is combined with a phosphor in a white pc-LED. If the dominant emission $\lambda_d$ of the LED die is close to the absorption maximum of the phosphor (about 460 nm for YAG:Ce and YGdAG:Ce), more blue light will be absorbed and more yellow light emitted. If the dominant emission wavelength $\lambda_d$ is further away from the absorption maximum of the phosphor, less blue light is absorbed and less yellow light is emitted resulting in a different white emission color.

One way to limit package-to-package variations in white pc-LEDs is to tightly bin the LED dies, i.e., preselect only LED dies that emit within a narrow range. However, tighter binning increases cost since a smaller percentage of the LED dies from a semiconductor manufacturer are suitable for use. Therefore, it would be an advantage to have a white pc-LED package that was less sensitive to the emission variations of blue LED dies.

SUMMARY OF THE INVENTION

It is an object of the invention to obviate the disadvantages of the prior art.

It is another object of the invention to provide a phosphor composition which renders white-light-emitting pc-LEDs less sensitive to variations in the blue emissions of LED dies.

It is a further object of the invention to provide a white pc-LED.

In accordance with an object of the invention, there is provided a phosphor for white pc-LED applications wherein the phosphor has a composition represented by $(Y_{1-x-y}Gd_xCe_y)_3(Al_{1-z}Sc_z)_5O_{12}$ wherein $0<x\le0.3$, $0<y\le0.04$ and $0<z\le0.3$. White pc-LEDs containing the phosphor of this invention are less sensitive to variations in the blue emission from LED dies in the wavelength range from about 445 nm to about 465 nm compared to conventional YAG:Ce and YGdAG:Ce phosphors.

In accordance with another aspect of the invention, there is provided a phosphor-conversion LED comprising: an LED die that emits a blue light and a phosphor for converting at least a portion of the blue light into light of a different wavelength, the phosphor having a composition represented by $(Y_{1-x-y}Gd_xCe_y)_3(Al_{1-z}Sc_z)_5O_{12}$ wherein $0<x\le0.3$, $0<y\le0.04$ and $0<z\le0.3$.

DETAILED DESCRIPTION OF THE INVENTION

For a better understanding of the present invention, together with other and further objects, advantages and capabilities thereof, reference is made to the following disclosure and appended claims taken in conjunction with the above-described drawings.

References to the color of a phosphor, LED or conversion material refer generally to its emission color unless otherwise specified. Thus, a blue LED emits a blue light, a yellow phosphor emits a yellow light and so on. The color measurements (Cx, Cy, CCT, CRI) described herein refer to measurements of the white light emitted by a pc-LED unless otherwise specified or a different meaning is clear from the context.

An LED "die" (also referred to as an LED "chip") is an LED in its most basic form, i.e., in the form of the small individual pieces produced by dicing the much larger wafer onto which the semiconducting layers were deposited. The LED die can include contacts suitable for the application of electric power. A pc-LED package (also referred to as a module) includes the LED die mounted onto a substrate and the phosphor conversion element. The pc-LED package may also include other conventional elements such as a silicone encapsulant, optically active components (lenses, reflective sides), a lead frame, and heat dissipating elements. The terms LED package, LED module, LED die etc. may be generally referred to herein by the broader term LED or pc-LED.

Figure 1:
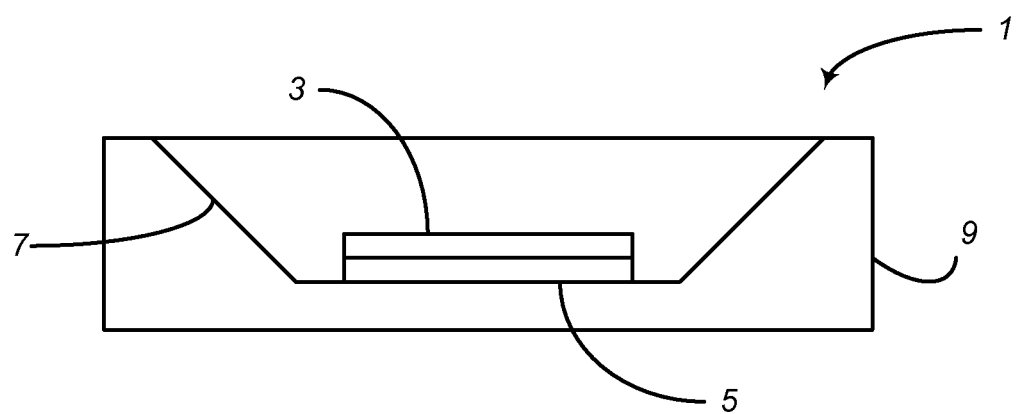
FIG. 1 is an illustration of an embodiment of a phosphor-conversion LED (pc-LED) according to this invention.

Referring now to the figures, FIG. 1 is an illustration of a phosphor-conversion LED 1. The blue-emitting LED die 5 is shown here mounted in a module 9 having a well 7 with reflective sides. Phosphor converter 3 is placed on top of the blue-emitting LED die 5 although it need not directly contact the surface of the LED die and in some cases may be mounted remotely from the surface of the LED die 5. The phosphor converter 3 in this embodiment is a thin, flat, solid ceramic piece formed by a ceramic forming method. More particularly, the powdered phosphor, or its oxide precursors, may be combined with a binder and formed into the desired shape by any one of pressing, injection molding, tape casting or extrusion and then heated at a sufficiently high temperature to form a sintered ceramic. The converter may be formed directly in its desired final shape, e.g., a thin plate, or machined after sintering to generate the final form.

Figure 2:
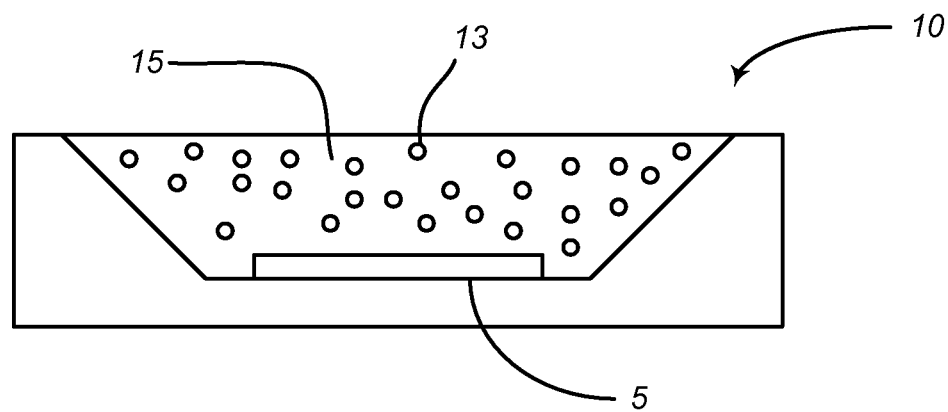
FIG. 2 is an illustration of an alternate embodiment of a pc-LED according to this invention.

Another embodiment of a pc-LED is shown in FIG. 2. In this case, the phosphor-conversion LED 10 has an LED die 5 that is encapsulated in a resin 15 in which particles of phosphor 13 are dispersed. It is also possible for the resin to be cast into an optical element, such as a lens or dome, and placed over the LED die. In such case, it is desirable for the intervening space to be filled with a transparent silicone to improve optical coupling. In any case, the phosphor of this invention may be used in all of the above configurations or any other pc-LED configuration suitable for use with conventional YAG:Ce phosphors.

The effect on the white emission of a pc-LED as a result of the variations in the blue emission of LED dies is illustrated in Table 1. Four white pc-LED packages were constructed using a conventional YAG:Ce phosphor dispersed in a silicone layer. (See, e.g., FIG. 2) The blue LED dies used to construct the white pc-LEDs had dominant emission wavelengths ($\lambda_d$) of 446, 451, 456 and 462 nm. As can be seen from the data in Table 1, the Cx, Cy color coordinates and color rendering index (CRI) increase, and the coordinated color temperature (CCT) decreases, as $\lambda_d$ increases. Notably, the Cx variation over this range is 0.0331 and the Cy variation is 0.0745. Since both color coordinates move in the same direction, the Cx coordinate is used herein for convenience as a measure of the sensitivity of the pc-LED to changes in the dominant wavelength of the LED die.

TABLE 1

| LED dominant emission wavelength ($\lambda_d$) | $C_x$ | $C_y$ | CCT (K) | CRI |
|---|---|---|---|---|
| 445 nm | 0.347 | 0.3322 | 4844 | 63.8 |
| 451 nm | 0.3631 | 0.3638 | 4428 | 64.9 |

TABLE 1-continued

| LED dominant emission wavelength ($\lambda_d$) | $C_x$ | $C_y$ | CCT (K) | CRI |
|---|---|---|---|---|
| 456 nm | 0.3725 | 0.3858 | 4279 | 66.9 |
| 462 nm | 0.3801 | 0.4067 | 4205 | 68.9 |
| Variation (max value − min value) | 0.0331 | 0.0745 | 639 | 5.1 |

Figure 3:
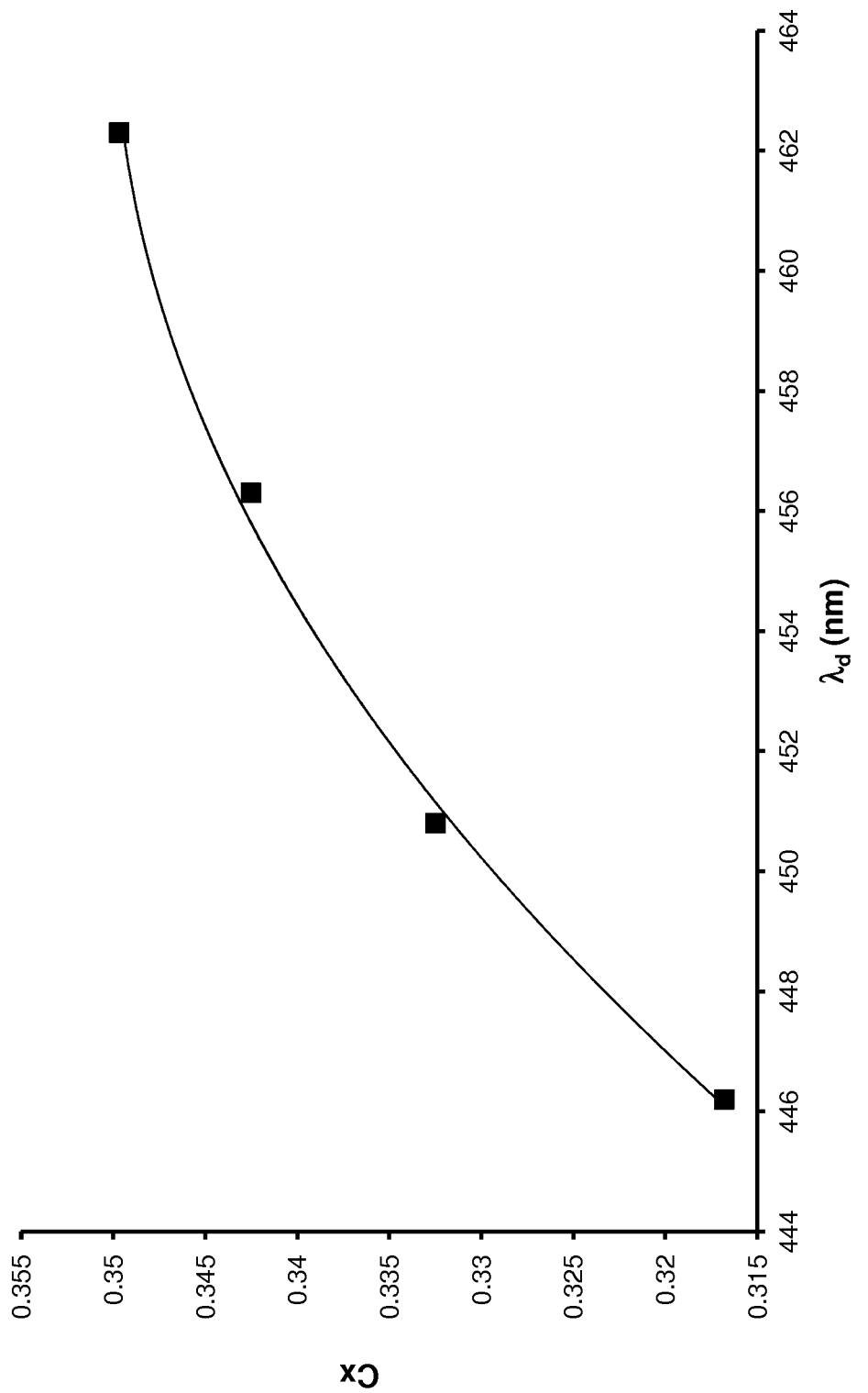
FIG. 3 is a graphical representation of the average change in the Cx color coordinate of the white emission of pc-LEDs containing a YGdAG:Ce phosphor plotted as a function of the dominant wavelength ($\lambda_d$) emitted by the blue LED die.
Figure 4:
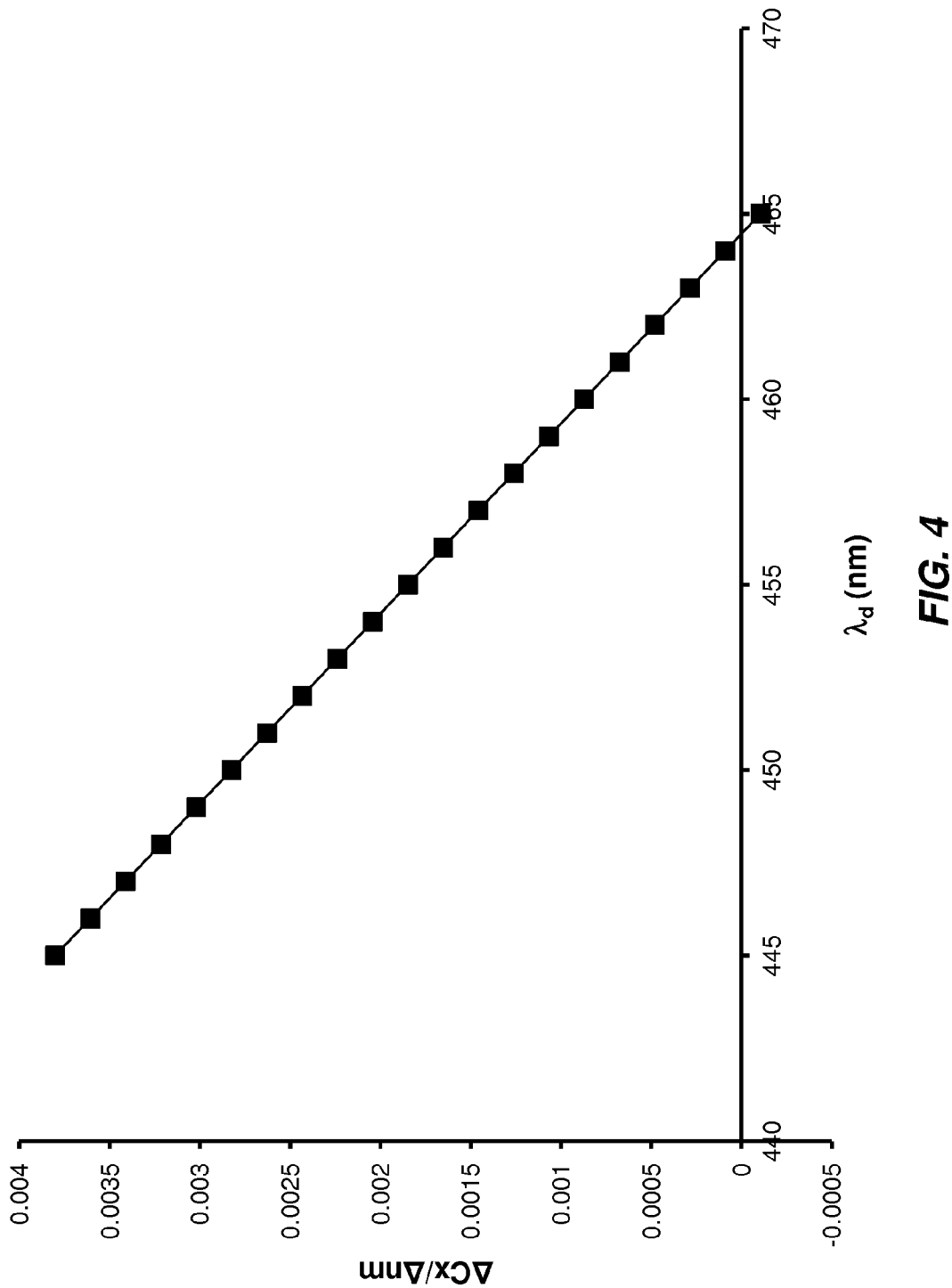
FIG. 4 is a graphical representation of the color sensitivity ($\Delta Cx/\Delta nm$) of the white emission of the pc-LED containing the YGdAG:Ce phosphor of FIG. 3 as a function of the dominate wavelength ($\lambda_d$) emitted by the blue LED die.

The same effect on the color of a white pc-LED using a YGdAG:Ce phosphor can be observed in FIGS. 3 and 4. In this case, a single-piece ceramic converter (See, e.g., FIG. 1) comprised of a YGdAG:Ce phosphor was used to construct the white pc-LEDs. Similar to the previous example, four different blue LEDs dies having $\lambda_d$'s of 446, 451, 456 and 462 nm were used. The average Cx values for these pc-LEDs are plotted in FIG. 3 and are shown to vary from about 0.315 at 446 nm to about 0.350 at 462 nm.

With reference to FIG. 4, the color sensitivity of the white pc-LED may be expressed as the first derivative of the curve in FIG. 3. The ordinate value, $\Delta Cx/\Delta nm$, represents how the Cx color coordinate responds to changes in the blue excitation provided by the LED die and functions as an indicator of the color sensitivity of the pc-LED. Thus, it is desirable that the absolute value of $\Delta Cx/\Delta nm$ (referred to herein as the absolute color sensitivity, $|\Delta Cx/\Delta nm|$) should be as small as possible to minimize the sensitivity of the pc-LED to variations in the blue emission of LED dies.

As described and shown above, white pc-LEDs containing YAG:Ce and YGdAG:Ce phosphors are very sensitive to variations in the dominant emission wavelength of the blue LED die. As a result, blue LED dies need to be pre-binned for white pc-LED production according to their dominant emission, $\lambda_d$, in order to make white pc-LEDs for a specific white color target. However, some white pc-LED applications, such as automotive headlamps, require an extremely tight color control, e.g., a Cx spread of only 0.006. It would be very difficult to meet this tight color requirement at a high yield even with pre-sorting blue dies. For example, a pc-LED with a YGdAG:Ce phosphor has a $\Delta Cx/\Delta nm$ of 0.003 nm at 445 nm. Even if the blue LED dies are binned at a narrow 2 nm, a color spread of about 0.006 is already built into the white pc-LED without taking into consideration any variations in the phosphor layer itself. Under this situation, the yield for the white pc-LEDs would be quite low leading to higher costs.

It has been found that one way to reduce the sensitivity of the pc-LED to variations in the blue LED die emission is to adjust the absorption characteristics of the YAG:Ce phosphor. More specifically, it has been found that incorporating a combination of certain additional rare earth elements, viz. scandium (Sc) and gadolinium (Gd), shifts the absorption peak wavelength of YAG:Ce phosphors to shorter wavelengths while at the same time maintaining a desirable emission color for white light applications. The shift of the absorption peak to shorter wavelengths places the absorption peak more squarely within the range of emissions from blue LED dies.

The changes brought about in the phosphor are believed to occur as a result of alterations in the environment in which the cerium (Ce) activator ion is situated. The YAG crystal lattice has a framework structure constructed of corner-linked octahedra ($AlO_6$) and tetrahedra ($AlO_4$), with a larger cation $Y^{3+}$ in an 8-coordinated site (or dodecahedral site). The $Ce^{3+}$ activator ion sits in a dodecahedral site in YAG:Ce efficiently absorbing blue light and emitting a broad band yellow luminescence as a result of a $4f^1$-$5d^1$ electronic transition. However, the electronic energy levels of the $Ce^{3+}$ ion are very sensitive to the crystal field around it. When a larger rare earth ion such as Gd is substituted for yttrium (Y) on the dodecahedral site, the yellow emission of the phosphor is shifted to a longer wavelength. The reverse effect occurs when a larger ion is substituted on the octahedral site, such as when gallium (Ga) substitutes for aluminum (Al). More importantly, it is has also been observed that the absorption peak of the YAG:Ce phosphor shifts to shorter wavelengths when Ga substitutes for Al. However, using a Ga substitution is impractical for some pc-LED applications since YGaAG:Ce is difficult to sinter because of the high vapor pressure of Ga.

A Sc substitution has been found to produce an effect similar to that of Ga in YGaAG:Ce. As the Sc concentration increases, the emission peak of the phosphor shifts to shorter wavelengths (towards the green region of the visible spectrum) and, more importantly, the absorption peak also shifts to shorter wavelengths. For example, a ceramic converter with a nominal composition of $(Y_{0.998}Ce_{0.002})_3(Al_{0.75}Sc_{0.25})_5O_{12}$ exhibits strong absorption near 445 nm compared to YAG:Ce and YGdAG:Ce phosphors which have an absorption peak near 460 nm. However, unlike YGaAG:Ce, there is no problem with sintering YScAG:Ce to form a solid ceramic wavelength converter.

Since the incorporation of Sc into YAG:Ce shifts the phosphor's emission away from yellow and towards the green region of the spectrum, it becomes more difficult to achieve a white emission from the pc-LED. To counteract this effect, Gd is added to shift the phosphor emission in the opposite direction, i.e., towards the red region of the spectrum. This can be done without significantly affecting the shift in the absorption peak.

Figure 5:
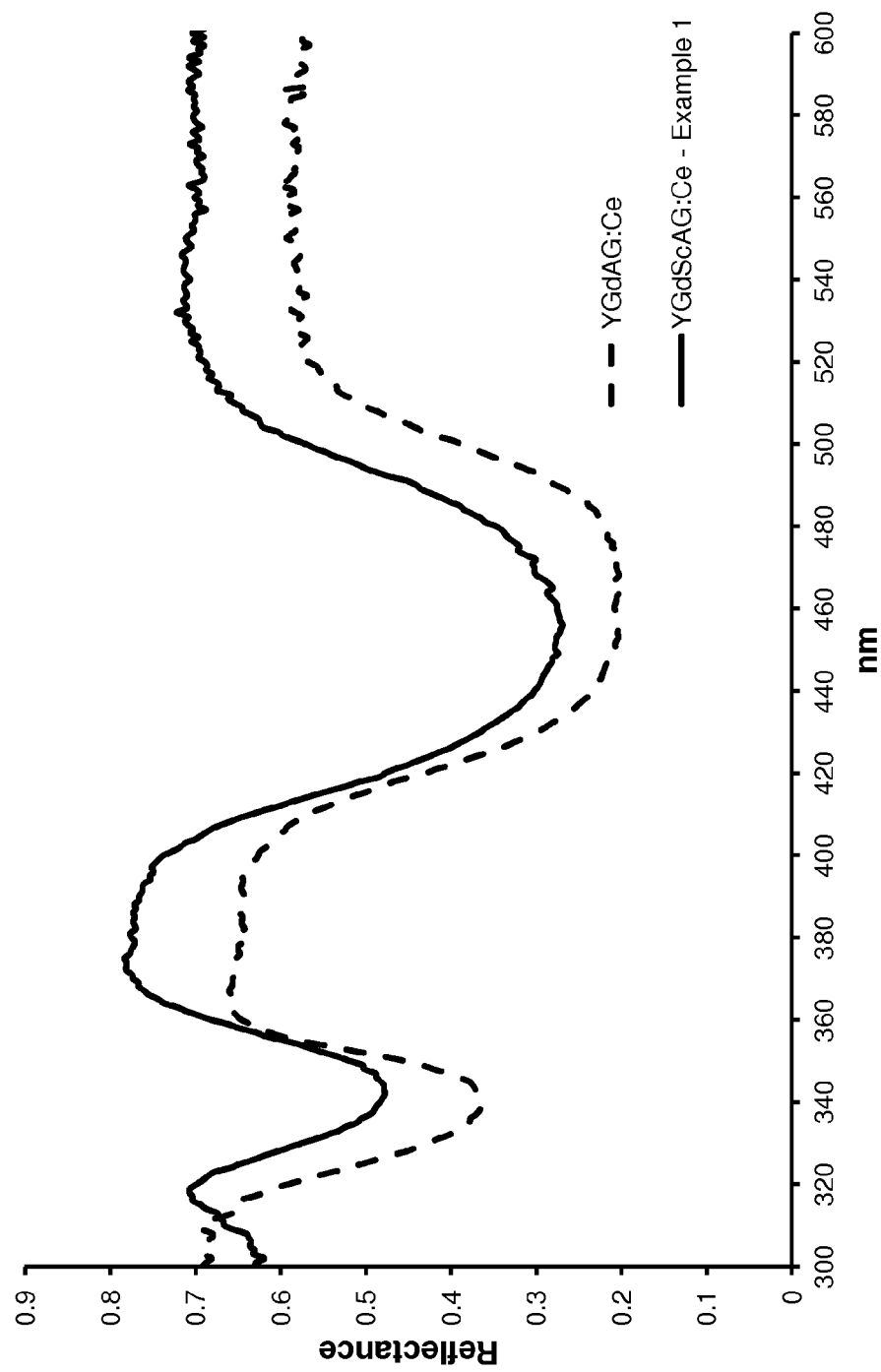
FIG. 5 compares the reflectance spectra of a YGdAG:Ce phosphor and a YGdScAG:Ce phosphor according to this invention.
Figure 6:
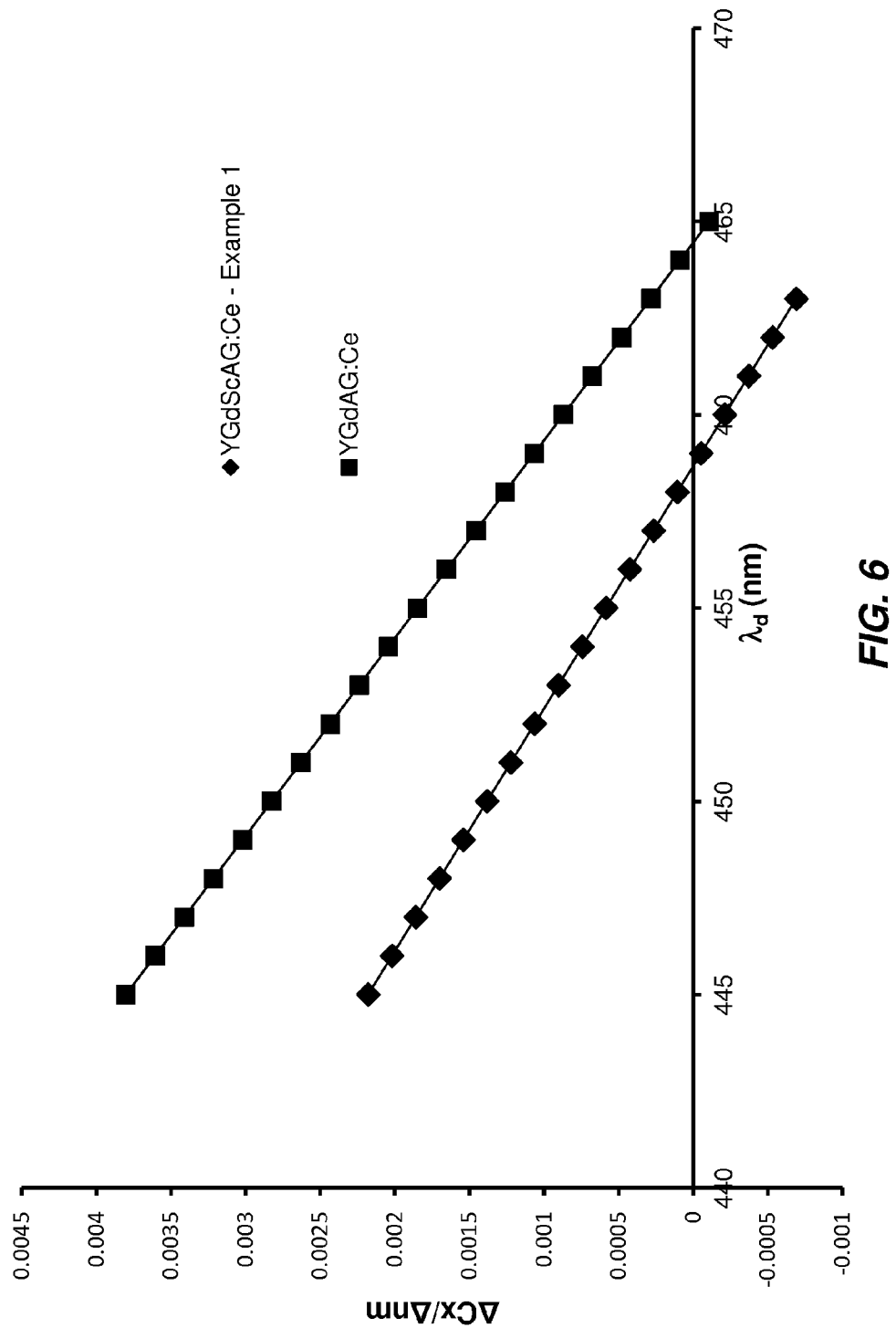
FIG. 6 compares the color sensitivity ($\Delta Cx/\Delta nm$) as a function of the dominant wavelength ($\lambda_d$) emitted by the blue LED die of pc-LEDs having a YGdAG:Ce phosphor and a YGdScAG:Ce phosphor according to this invention.

For example, FIG. 5 compares the reflectance spectra of a YGdScAG:Ce ceramic converter with a nominal composition of $(Y_{0.797}Gd_{0.20}Ce_{0.003})_3(Al_{0.9}Sc_{0.1})_5O_{12}$ and a YGdAG:Ce phosphor. The absorption peak of the YGdScAG:Ce phosphor is shifted so that it is substantially near the center of the desired range of about 445 nm to about 465 nm whereas the absorption peak for the YGdAG:Ce phosphor is centered on the upper portion of that range at about 460 nm. A comparison of the color sensitivity ($\Delta Cx/\Delta nm$) of these pc-LEDs as a function of the dominant wavelength ($\lambda_d$) is shown in FIG. 6. In the case of the YGdAG:Ce phosphor, $\Delta Cx/\Delta nm$ ranges from about 0 at 465 nm to almost 0.004 at 445 nm. Whereas, in the case of the YGdScAG:Ce phosphor of this invention, the absolute color sensitivity, $|\Delta Cx/\Delta nm|$, is less than or equal to about 0.002 over the range of dominant wavelengths from 445 nm to 465 nm.

Figure 7:
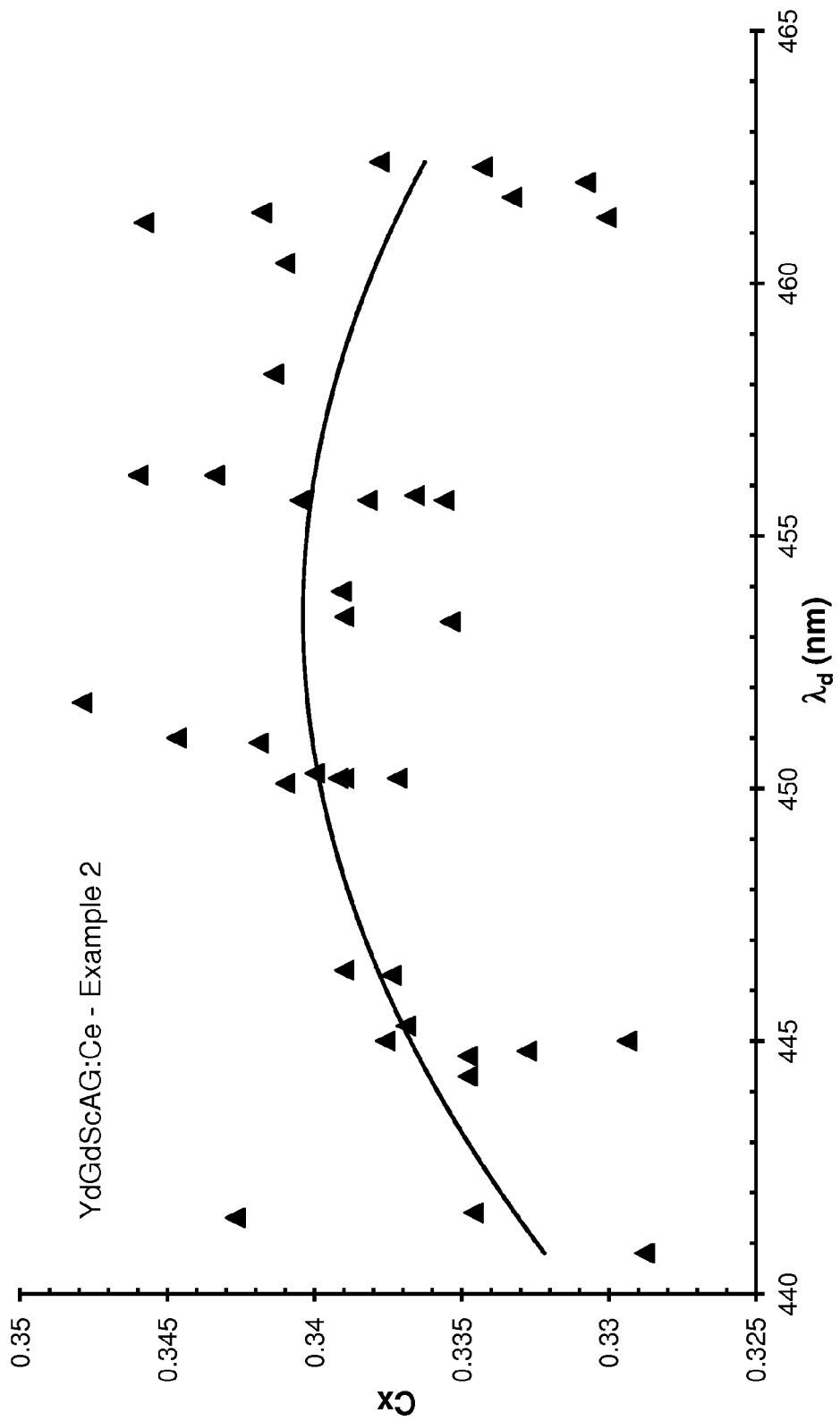
FIG. 7 is a graphical representation of the Cx color coordinate of the white emission of several pc-LEDs containing a second YGdScAG:Ce phosphor according to this invention plotted as a function of the dominant wavelength ($\lambda_d$) emitted by the blue LED die.
Figure 8:
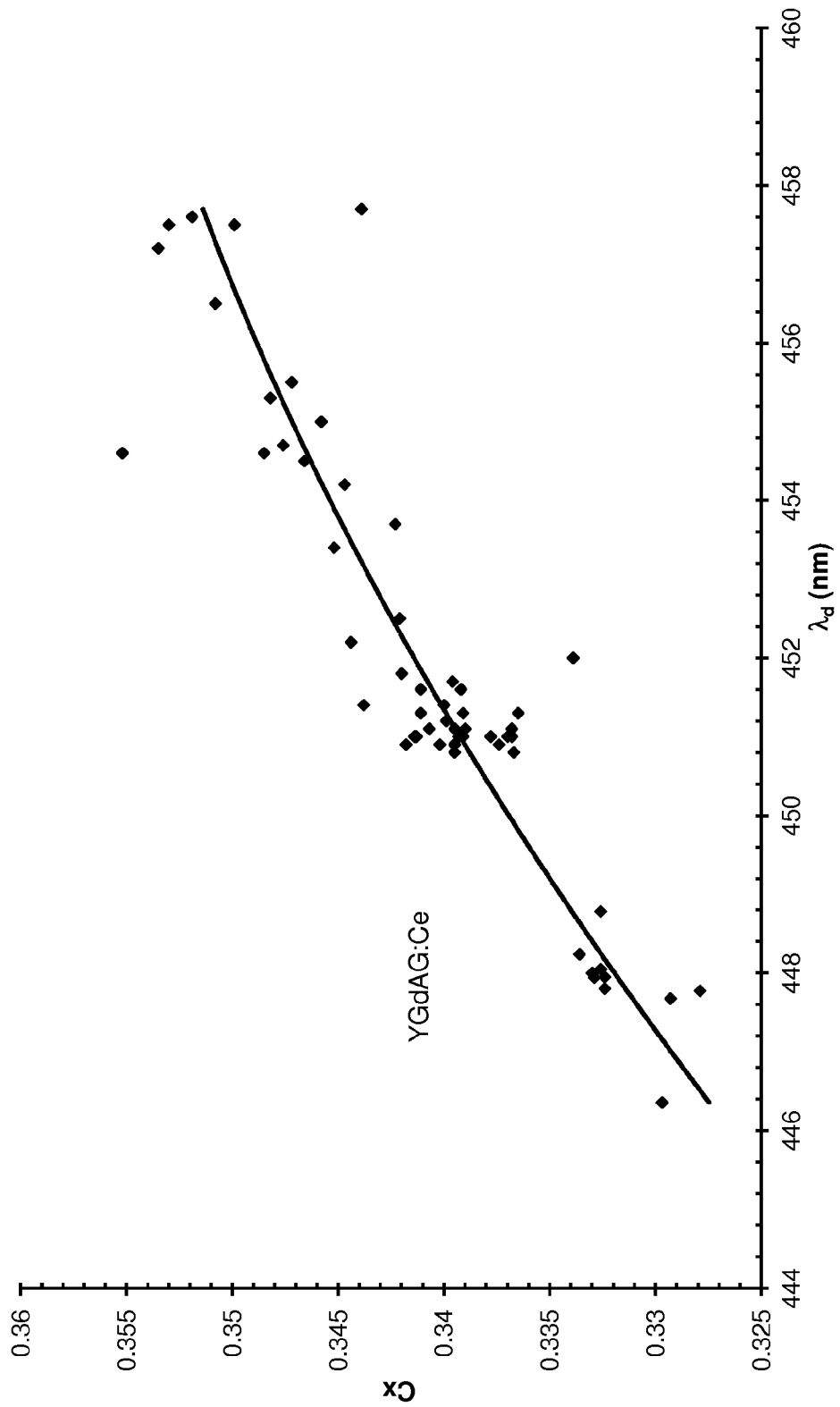
FIG. 8 is a graphical representation of the Cx color coordinate of the white emission of several pc-LEDs containing a YGdAG:Ce phosphor plotted as a function of the dominant wavelength ($\lambda_d$) emitted by the blue LED die.
Figure 9:
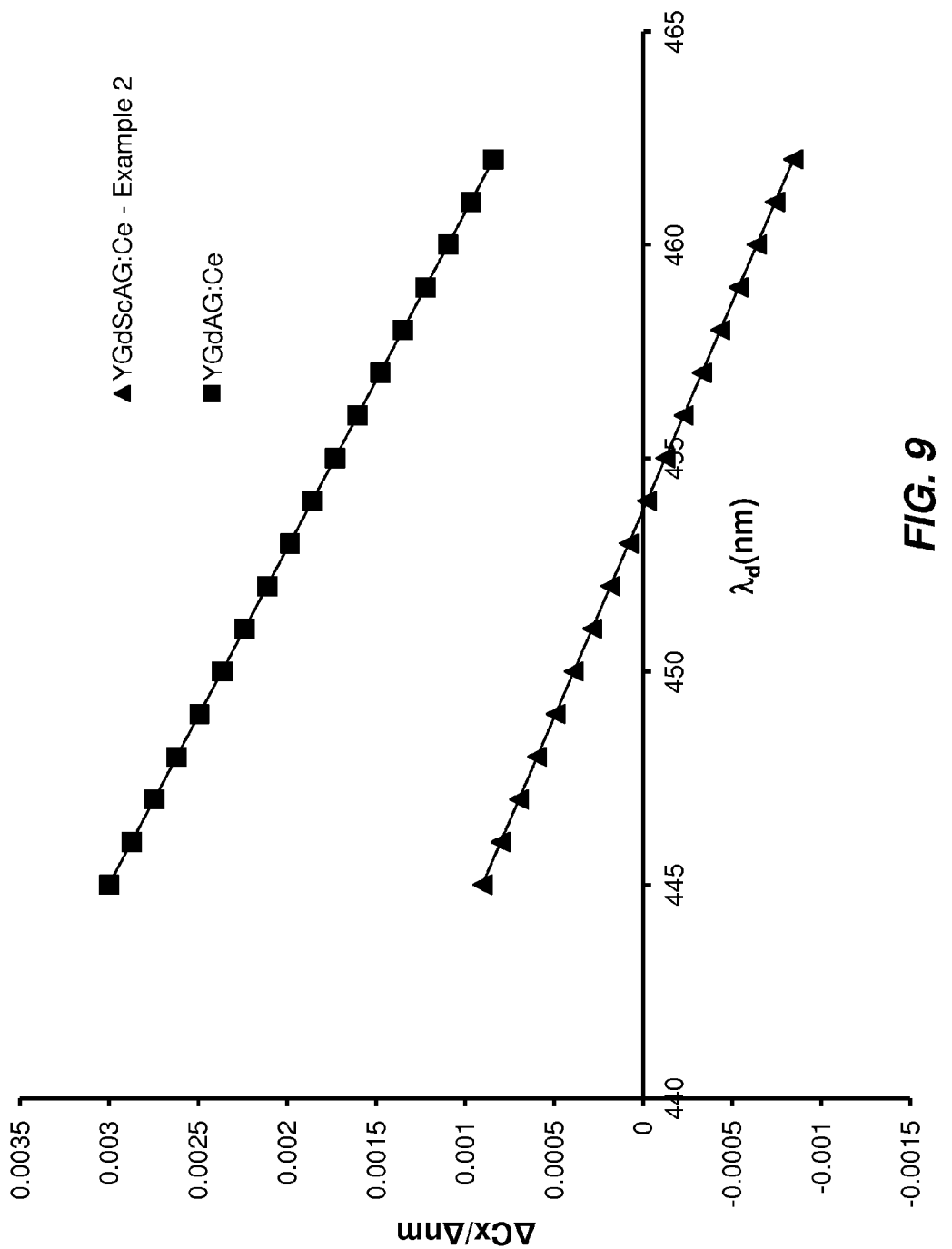
FIG. 9 compares the color sensitivity ($\Delta Cx/\Delta nm$) as a function of the dominant wavelength ($\lambda_d$) emitted by the blue LED die of pc-LEDs having a YGdAG:Ce phosphor and the second YGdScAG:Ce phosphor according to this invention.

In another example, several white pc-LEDs made with (1) a YGdScAG:Ce phosphor having a nominal composition of $(Y_{0.697}Gd_{0.30}Ce_{0.003})_3(Al_{0.8}Sc_{0.2})_5O_{12}$ and (2) a YGdAG:Ce phosphor are compared in FIGS. 7-9. In both cases, the phosphor was in the form of a solid, sintered ceramic converter. The pc-LEDs are shown in FIGS. 7 and 8 to exhibit a similar range of Cx values, from about 0.325 to about 0.355. However, in the case of the pc-LEDs made with the YGdScAG:Ce phosphor, the Cx values exhibit a maximum near 454 nm, while the Cx values of the pc-LEDs made with the conventional YGdAG:Ce phosphor continue to increase as the dominant wavelength $\lambda_d$ increases. This difference in color sensitivity to $\lambda_d$ is apparent in FIG. 9 which compares the values of $\Delta Cx/\Delta nm$ for the two groups of pc-LEDs over the $\lambda_d$ range of about 445 nm to about 465 nm. In particular, the range of values for $\Delta Cx/\Delta nm$ is much lower for the pc-LEDs using the YGdScAG:Ce phosphor of this invention compared to the conventional YGdAG:Ce. In the case of the pc-LEDs with the YGdScAG:Ce phosphor, the absolute value of $\Delta Cx/\Delta nm$ is less than or equal to about 0.001 whereas $\Delta Cx/\Delta nm$ reaches a high of about 0.003 over the same range for the pc-LEDs with the conventional YGdAG:Ce phosphor. Thus it will be much easier to control the color of white pc-LEDs made with the phosphor of this invention over the $\lambda_d$ range of about 445 nm to about 465 nm.

A new phosphor has been demonstrated for use in white pc-LEDs. The white emission of a pc-LED incorporating the YGdScAG:Ce phosphor of this invention exhibits less color sensitivity to die-to-die variations in the dominant emission wavelength of the blue-emitting LED die, particularly in the range of about 445 nm to about 465 nm. Preferably, the absolute color sensitivity of the white pc-LED incorporating the YGdScAG:Ce phosphor as represented by $|\Delta Cx/\Delta nm|$ is less than or equal to about 0.002 and, more preferably, less than or equal to about 0.001. The phosphor of this invention can be used in either a powder or sintered ceramic form. Preferably the phosphor has been sintered to form a translucent ceramic piece that is mounted to the blue-emitting LED die to generate a white light. More preferably, the sintered converters may be made by mixing oxide powders in the desired stoichiometric proportions, forming mixture into the desired shape, and sintering at a temperature in a range from about 1800° C. to about 1870° C. The phosphor may also be used in a converter element that is remote from the blue-emitting LED, for example, as phosphor particles embedded in a polymer film which is placed at a distance from the LED, or an array of LEDs, or formed as a dome which is placed over individual or multiple LEDs.

While there have been shown and described what are at present considered to be the preferred embodiments of the invention, it will be apparent to those skilled in the art that various changes and modifications can be made herein without departing from the scope of the invention as defined by the appended claims.

We claim:

1. A phosphor having a composition represented by $(Y_{1-x-y}Gd_xCe_y)_3(Al_{1-z}Sc_z)_5O_{12}$ wherein $0.15<x\leq0.3$, $0.002<y\leq0.003$ and $0.1<z\leq0.2$.

2. A phosphor-conversion LED comprising: an LED die that emits a blue light and a phosphor for converting at least a portion of the blue light into light of a different wavelength, the phosphor having a composition represented by $(Y_{1-x-y}Gd_xCe_y)_3(Al_{1-z}Sc_z)_5O_{12}$ wherein $0.15<x\leq0.3$, $0.002<y\leq0.003$ and $0.1<z\leq0.2$.

3. The phosphor-conversion LED of claim 2 wherein the blue light has a dominant emission wavelength within a wavelength range from about 445 nm to about 465 nm.

4. The phosphor-conversion LED of claim 3 wherein the phosphor-conversion LED has an absolute color sensitivity, $|\Delta Cx/\Delta nm|$, of less than or equal to about 0.002 over the wavelength range.

5. The phosphor-conversion LED of claim 3 wherein the phosphor-conversion LED has an absolute color sensitivity, $|\Delta Cx/\Delta nm|$, of less than or equal to about 0.001 over the wavelength range.

* * * * *